(12) United States Patent
Yoneda et al.

(10) Patent No.: US 9,252,716 B2
(45) Date of Patent: Feb. 2, 2016

(54) HIGH-FREQUENCY AMPLIFIER CIRCUIT, SEMICONDUCTOR DEVICE, AND MAGNETIC RECORDING AND REPRODUCING DEVICE

(71) Applicant: TDK CORPORATION, Tokyo (JP)

(72) Inventors: Sadaharu Yoneda, Tokyo (JP); Atsushi Ajioka, Tokyo (JP); Tomohiko Shibuya, Tokyo (JP); Atsushi Tsumita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1 day.

(21) Appl. No.: 14/250,118

(22) Filed: Apr. 10, 2014

(65) Prior Publication Data

US 2014/0312972 A1  Oct. 23, 2014

(30) Foreign Application Priority Data

Apr. 18, 2013 (JP) ................................. 2013-087510
Mar. 5, 2014 (JP) ................................. 2014-042385

(51) Int. Cl.
*H03F 3/45* (2006.01)
*H03F 1/08* (2006.01)
*H03F 3/19* (2006.01)
*H03F 3/26* (2006.01)

(52) U.S. Cl.
CPC .................. *H03F 1/083* (2013.01); *H03F 3/19* (2013.01); *H03F 3/26* (2013.01); *H03F 3/45475* (2013.01); *H03F 3/45928* (2013.01); *H03F 2200/06* (2013.01); *H03F 2200/405* (2013.01); *H03F 2200/451* (2013.01); *H03F 2200/537* (2013.01)

(58) Field of Classification Search
CPC ............ H03F 2200/06; H03F 2200/09; H03F 2200/372; H03F 2200/294; H03F 3/28; H03F 3/36; H03F 3/45475; H03F 1/16; H03F 1/50; H03F 11/32; H03F 3/45; H03F 3/68; H03H 11/32; H03H 7/00; H03H 7/42; H03H 11/02; H03H 11/36; H01P 5/10; H01F 17/00; H01F 19/08
USPC ........... 330/55, 116–117, 301–302, 165, 167, 330/144; 360/46, 67, 68
See application file for complete search history.

(56) References Cited

U.S. PATENT DOCUMENTS

2013/0207721 A1 * 8/2013 Mulawski et al. ............ 330/253

FOREIGN PATENT DOCUMENTS

JP  A-2002-305418  10/2002
WO  WO 2013014881 A1 *  1/2013

* cited by examiner

*Primary Examiner* — Steven J Mottola
*Assistant Examiner* — Hafizur Rahman
(74) *Attorney, Agent, or Firm* — Oliff PLC

(57) ABSTRACT

A high-frequency amplifier circuit includes a balanced-unbalanced converter converting a single-ended signal into differential signals. The output of a first amplifier amplifying the single-ended signal is connected to the signal terminal on the unbalanced side of the balanced-unbalanced converter. The input of a second amplifier amplifying one of the differential signals is connected to one signal terminal on the balanced side of the balanced-unbalanced converter. The input of a third amplifier amplifying another of the differential signals is connected to another signal terminal on the balanced side of the balanced-unbalanced converter. An impedance element is inserted between an element on the balanced side of the balanced-unbalanced converter and a ground.

11 Claims, 3 Drawing Sheets

HIGH-FREQUENCY AMPLIFIER CIRCUIT, SEMICONDUCTOR DEVICE, AND MAGNETIC RECORDING AND REPRODUCING DEVICE

BACKGROUND

The present invention relates to a high-frequency amplifier circuit that outputs differential signals, a semiconductor device, and a magnetic recording and reproducing device.

High-frequency amplifier circuits used in radio communication and the like widely employ a multistage configuration using a plurality of amplifiers so as to attain desired power for a load. Furthermore, differential signals are used for various purposes, such as improving noise immunity and reducing power consumption, and in cases where it is difficult to place a ground electrode. However, in the case where a high-frequency amplifier circuit having a multistage configuration outputs differential signals, for example, when a common-mode component is generated in the circuit, abnormal oscillation may occur in the amplifier via a feedback path, such as a power line or a signal line, which has been a problem. Note that in order to output differential signals at the last stage in a high-frequency amplifier circuit, one differential amplifier including two amplifiers having the same properties or a dual configuration including two amplifiers having the same properties placed in parallel may be used.

CITED REFERENCES

Patent Reference

[Patent Literature 1] Japanese Unexamined Patent Application Publication No. 2002-305418

SUMMARY

For example, a technique disclosed in Patent Literature 1 relates to an N—(N is an integer equal to or larger than 2) stage amplifier circuit as illustrated in FIG. 5, which is an amplifier circuit including a differential amplifier 18 that constitutes at least the last stage and having high gain properties. Of the two output signals, one output signal is grounded via a termination resistor 19 and the other output signal is outputted via an output matching circuit 21. That is, one of the differential signals outputted from an amplifier circuit 10A is not used but only the other signal is used, resulting in single-ended output to a load (not illustrated). Therefore, a feedback path is not formed between the differential amplifier 18, which constitutes the last stage, and the load. However, abnormal oscillation may occur in the amplifier via a feedback path of a power source or a ground that is shared, which has been a problem.

The technique disclosed in Patent Literature 1 relates to an invention intended to achieve single output of differential signals. In an amplifier circuit 10B (a modification of Patent Literature 1) illustrated in FIG. 6, for example, one of the differential signals outputted from the amplifier circuit 10B is not grounded via a termination resistor but is outputted via an output matching circuit 23 and therefore the differential signals are outputted to a load. In this case, if the load, that is, an inductive load 24, is formed of a coil or the like, a feedback path is formed between the differential amplifier 18, which constitutes the last stage, and the inductive load 24 and abnormal oscillation may occur in the amplifier via the feedback path, which has been a problem.

The present invention has been made in view of the existing problems described above, and an object thereof is to provide a high-frequency amplifier circuit in which a common-mode component that may cause abnormal oscillation is reduced and stable amplification operations are performed.

According to a first aspect of the present invention for achieving the above-described object, there is provided a high-frequency amplifier circuit including a balanced-unbalanced converter converting a single-ended signal into differential signals. An output of a first amplifier amplifying the single-ended signal is connected to a signal terminal on an unbalanced side of the balanced-unbalanced converter, an input of a second amplifier amplifying one of the differential signals is connected to one signal terminal on a balanced side of the balanced-unbalanced converter, an input of a third amplifier amplifying another of the differential signals is connected to another signal terminal on the balanced side of the balanced-unbalanced converter, and an impedance element is inserted between an element on the balanced side of the balanced-unbalanced converter and a ground.

In the case of a high-frequency amplifier circuit in which a balanced-unbalanced converter is connected to the interstage of the amplifiers and differential signals are outputted, a feedback path is formed between the high-frequency amplifier circuit and a load and therefore, when a common-mode component is generated in the circuit, abnormal oscillation occurs in the second amplifier and the third amplifier located in the feedback path. In the case where a power source or a ground is shared, abnormal oscillation also occurs via a feedback path thereof. However, according to the above-described aspect of the present invention, an impedance element is inserted between an element on the balanced side of the balanced-unbalanced converter and the ground. Accordingly, common-mode components that are to flow into the second amplifier and the third amplifier are reduced in advance and therefore stable amplification operations can be performed.

Furthermore, according to a second aspect of the present invention, in the high-frequency amplifier circuit, the impedance element includes at least one resistive element.

According to the above-described aspect of the present invention, in the case where the impedance element is constituted by one resistive element, the increase in the circuit size can be suppressed while the effect of reducing a common-mode component can be achieved.

Furthermore, according to a third aspect of the present invention, in the high-frequency amplifier circuit, the impedance element includes a plurality of resistive elements connected in series and, to a front and a back of at least one of the plurality of resistive elements, a wiring line short-circuiting the at least one resistive element or a wiring line including an opening is connected.

According to the above-described aspect of the present invention, the impedance element includes a plurality of resistive elements connected in series and, to a front and a back of at least one of the plurality of resistive elements, a wiring line short-circuiting the at least one resistive element or a wiring line including an opening is connected. Accordingly, the impedance can be changed by performing wiring processing and therefore it is possible to adjust the effect of reducing a common-mode component.

Furthermore, according to a fourth aspect of the present invention, in the high-frequency amplifier circuit, the impedance element has an impedance that is equal to approximately a quarter of a combined impedance of the second amplifier and the third amplifier. Note that the combined impedance of the second amplifier and the third amplifier is obtained by adding the input impedance of the second amplifier and the input impedance of the third amplifier.

According to the above-described aspect of the present invention, the impedance element has an impedance that is equal to approximately a quarter of the combined impedance of the second amplifier and the third amplifier. Accordingly, the effect of reducing a common-mode component can be further increased and more stable amplification operations can be performed.

Furthermore, according to a fifth aspect of the present invention, there is provided a semiconductor device including the high-frequency amplifier circuit according to any of the above-described aspects formed therein.

According to the above-described aspect of the present invention, in the case where an element constituting the high-frequency amplifier circuit is formed on the semiconductor substrate, the size of the circuit can be substantially decreased and therefore mounting in a mobile communication device, such as a mobile phone terminal, is possible.

Furthermore, according to a sixth aspect of the present invention, there is provided a magnetic recording and reproducing device including the high-frequency amplifier circuit according to any of the above-described aspects or the semiconductor device mounted therein.

According to the above-described aspect of the present invention, data can be recorded stably at a high density by using the high-frequency amplifier circuit according to any of the above-described aspects or the semiconductor device. It is preferable to use the high-frequency amplifier circuit or the semiconductor device in a microwave excitation device, because the microwave excitation device may require differential signal output, the microwave excitation device being a source of a signal for a microwave magnetic field used when recording data on a magnetic recording medium having a recording layer with a smaller bit size and a higher coercive force.

According to the present invention, in a high-frequency amplifier circuit having a multistage configuration which outputs differential signals, a common-mode component that may cause abnormal oscillation can be reduced. Accordingly, a high-frequency amplifier circuit in which stable amplification operations are performed can be provided.

DETAILED DESCRIPTION OF EMBODIMENTS

Preferable embodiments for implementing the present invention will be described in detail with reference to the drawings. The following description of the embodiments is not intended to limit the present invention. The constituent elements described below include those that a person skilled in the art could easily assume, those that are substantially the same as the constituent elements, or those that fall within the scope of equivalents of the constituent elements. The constituent elements described below may be combined as appropriate. Furthermore, the constituent elements may be omitted, replaced, or modified without departing from the spirit of the present invention.

First Embodiment

Figure 1:
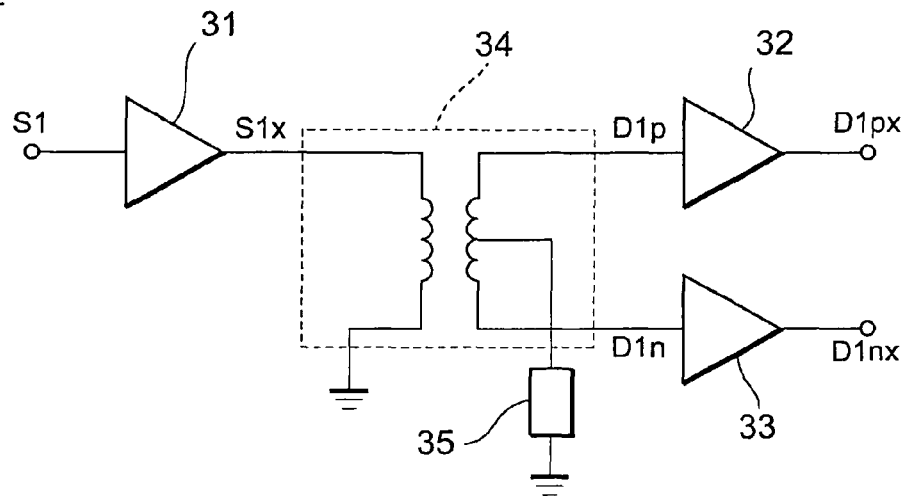
FIG. 1 is a circuit diagram of a high-frequency amplifier circuit 30 according to a first embodiment.

FIG. 1 is a circuit diagram of a high-frequency amplifier circuit 30 according to a first embodiment. As illustrated in FIG. 1, the high-frequency amplifier circuit 30 is constituted by a first amplifier 31, a second amplifier 32, a third amplifier 33, a balanced-unbalanced converter 34, and an impedance element 35.

The output of the first amplifier 31 is connected to the signal terminal on the unbalanced side of the balanced-unbalanced converter 34, the input of the second amplifier 32 is connected to one signal terminal on the balanced side of the balanced-unbalanced converter 34, the input of the third amplifier 33 is connected to another signal terminal on the balanced side of the balanced-unbalanced converter 34, and the impedance element 35 is inserted between an element on the balanced side of the balanced-unbalanced converter 34 and the ground.

Note that, in a circuit outputting differential signals, for attaining desired amplitude balance or phase balance, it is preferable that elements and wiring be configured so as to maintain symmetric properties of the circuit. Therefore, it is preferable that the impedance element 35 be connected to the midpoint of the element on the balanced side of the balanced-unbalanced converter 34. The midpoint of the element on the balanced side of the balanced-unbalanced converter 34 is a point at which the impedance seen from the point toward the second amplifier 32 side is equal to the impedance seen from the point toward the third amplifier 33 side.

In the high-frequency amplifier circuit 30, a single-ended signal S1 is inputted to the first amplifier 31, a single-ended signal S1x obtained as a result of amplification performed by the first amplifier 31 is outputted from the first amplifier 31, and the single-ended signal S1x is inputted to the signal terminal on the unbalanced side of the balanced-unbalanced converter 34. Differential signals D1p and D1n obtained as a result of conversion from the single-ended signal S1x performed by the balanced-unbalanced converter 34 are respectively outputted from one signal terminal and another signal terminal on the balanced side of the balanced-unbalanced converter 34, the differential signals D1p and D1n are respectively inputted to the second amplifier 32 and the third amplifier 33, and differential signals D1px and D1nx obtained as a result of amplification performed by the second amplifier 32 and the third amplifier 33 are outputted from the second amplifier 32 and the third amplifier 33 respectively.

As described above, in the case where amplification operations are performed in the high-frequency amplifier circuit 30, if the impedance element 35 is not used, generation of a common-mode component in the circuit caused by various factors including an asymmetric element or asymmetric wiring leads to a state in which amplification continues in the second amplifier 32 and the third amplifier 33, which are located in a feedback path, that is, so-called abnormal oscillation, because of the feedback path being formed between the high-frequency amplifier circuit 30 and a load (not illustrated). This is a problem in that amplification operations become unstable.

However, if the impedance element 35 is inserted between the element on the balanced side of the balanced-unbalanced converter 34 and the ground, a common-mode component generated in the circuit is reduced by the impedance element 35. Therefore, common-mode components that flow into the second amplifier 32 and the third amplifier 33 become substantially small, abnormal oscillation is suppressed, and stable amplification operations can be performed.

Note that the impedance element 35 is designed so as to have a certain impedance value at a frequency with which the high-frequency amplifier circuit 30 operates, and voltage drop occurs when an electric current flows therein. Specifically, a resistive element is an example of the impedance element 35, or an inductive element or a capacitive element may be used. If the impedance element is constituted only by a resistive element, the increase in the circuit size can be suppressed while the effect of reducing a common-mode component can be achieved. The high-frequency amplifier circuit 30 of the first embodiment outputs differential signals and therefore employs a dual configuration in which the second amplifier 32 and the third amplifier 33 are placed in parallel. However, one differential amplifier including two amplifiers, that is, a second amplifier and a third amplifier, may be used in place of the second amplifier 32 and the third amplifier 33.

Second Embodiment

Figure 2:
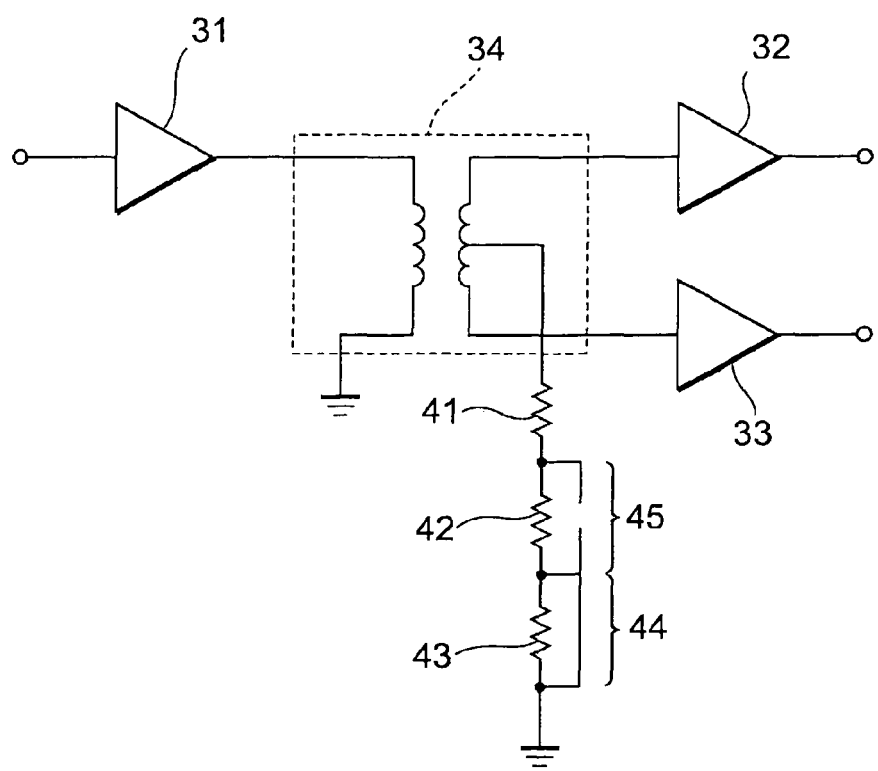
FIG. 2 is a circuit diagram of a high-frequency amplifier circuit 40 according to a second embodiment.

FIG. 2 is a circuit diagram of a high-frequency amplifier circuit 40 according to a second embodiment. The difference from the high-frequency amplifier circuit 30 according to the first embodiment illustrated in FIG. 1 is that the impedance element includes a plurality of resistive elements connected in series and that, to the front and back of at least one of the plurality of resistive elements, a wiring line short-circuiting the one resistive element or a wiring line including an opening is connected. As illustrated in FIG. 2, the impedance element includes a plurality of resistive elements 41, 42, and 43 connected in series, and the connecting point between the resistive elements 41 and 42 and the connecting point between the resistive elements 42 and 43 are connected by a wiring line 45 including an opening, so that the wiring line 45 including an opening is connected to the front and back of the resistive element 42. The connecting point between the resistive elements 42 and 43 and the connecting point between the resistive element 43 and the ground are connected by a wiring line 44 without an opening, so that the wiring line 44 that short-circuits the resistive element 43 is connected to the front and back of the resistive element 43.

The impedance of the impedance element illustrated in FIG. 2 is equal to the combined impedance of the resistive elements 41 and 42 when no processing is performed, is equal to the impedance of only the resistive element 41 when the wiring line 45 is connected by performing wiring processing, and is equal to the combined impedance of the resistive elements 41, 42, and 43 when the wiring line 44 is cut by performing wiring processing. In other words, the impedance of the impedance element can be changed and therefore it is possible to adjust the effect of reducing a common-mode component.

Note that, in the embodiment described above, three resistive elements are used, however, the number of resistive elements may be two. By connecting, to the front and back of at least one of the two resistive elements, a wiring line short-circuiting the one resistive element or a wiring line including an opening, the impedance of the impedance element can be changed by performing wiring processing and therefore it is possible to adjust the effect of reducing a common-mode component. The number of resistive elements may be four or more. A plurality of resistive elements, inductive elements, and capacitive elements may be combined. Furthermore, series connection and parallel connection may be combined.

Third Embodiment

Figure 3:
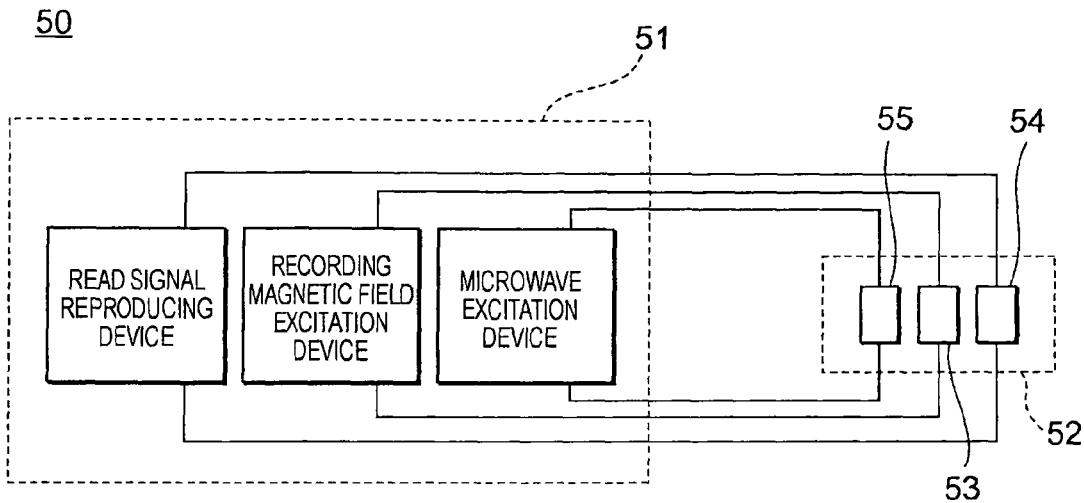
FIG. 3 is a block diagram of a magnetic recording and reproducing device 50 according to a third embodiment.

FIG. 3 is a block diagram of a magnetic recording and reproducing device 50 according to a third embodiment. As illustrated in FIG. 3, the magnetic recording and reproducing device 50 is constituted by a magnetic head drive circuit 51 and a magnetic head 52. The magnetic head drive circuit 51 includes a recording magnetic field excitation device, a read signal reproducing device, and a microwave excitation device. The magnetic head 52 includes a recording head 53, a reproducing head 54, and an assisting head 55.

In a general magnetic recording and reproducing device, a recording magnetic field generated as a result of a recording signal having been inputted from the recording magnetic field excitation device to the recording head is applied from the recording head to a recording layer of a magnetic recording medium (not illustrated) to thereby record data. The recorded data is read by the reproducing head, and a data signal is transmitted to the read signal reproducing device and processed.

However, in order to improve the recording density, the bit size of a recording layer of the magnetic recording medium needs to be made smaller. On the other hand, the smaller bit size leads to lack of thermal stability and loss of the recording state is a concern. Accordingly, a magnetic recording medium having a recording layer with a higher coercive force needs to be used. However, if the coercive force of a recording layer is high, data cannot be recorded only with a recording magnetic field of the recording head. Accordingly, in a recently anticipated Micro-wave-Assisted Magnetic Recording method, a microwave magnetic field is applied as auxiliary means for effectively reducing the coercive force of a recording layer only at the time of recording, and a microwave magnetic field is superimposed on the recording magnetic field of the recording head to thereby record data.

Accordingly, in the magnetic recording and reproducing device 50 according to the third embodiment, in addition to operations performed by a general magnetic recording and reproducing device described above, a microwave magnetic field generated by a microwave signal having been inputted from the microwave excitation device to the assisting head 55 is superimposed on a recording magnetic field of the recording head 53 and is applied to a recording layer the bit size of which is made smaller and which has a higher coercive force to thereby enable data recording.

In the magnetic head 52 that includes the recording head 53 and the assisting head 55, it may be more preferable to use, as a signal inputted to the assisting head 55, a differential signal than a single-ended signal because of the structure thereof. A signal inputted to the assisting head 55 is a signal of a microwave band, and a propagation loss occurring between the microwave excitation device and the assisting head 55 is high. Therefore, it may be preferable to use a plurality of amplifiers in a multistage configuration. On the other hand, the assisting head 55 may be configured as an inductive load in order to generate a microwave magnetic field and therefore a feedback path is formed between the assisting head 55 and an amplifier at the last stage, which has a problem of abnormal oscillation occurring in the amplifier.

That is, it is preferable that the magnetic recording and reproducing device of the present invention use the high-frequency amplifier circuit 30 of the first embodiment or the high-frequency amplifier circuit 40 of the second embodiment as the microwave excitation device. By using these high-frequency amplifier circuits, it is possible to stably record data at a high density.

EXAMPLES

The present invention will be specifically described with reference to an example, however, the present invention is not limited to the following example.

Example 1

Figure 4:
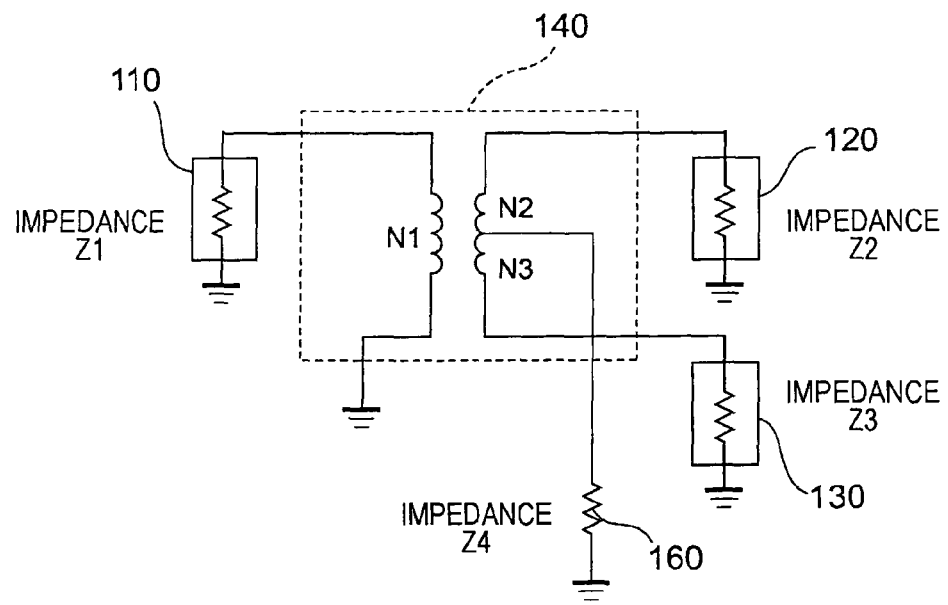
FIG. 4 is a circuit diagram illustrating a simulation configuration of a high-frequency amplifier circuit 100 according to Example 1.
Figure 5:
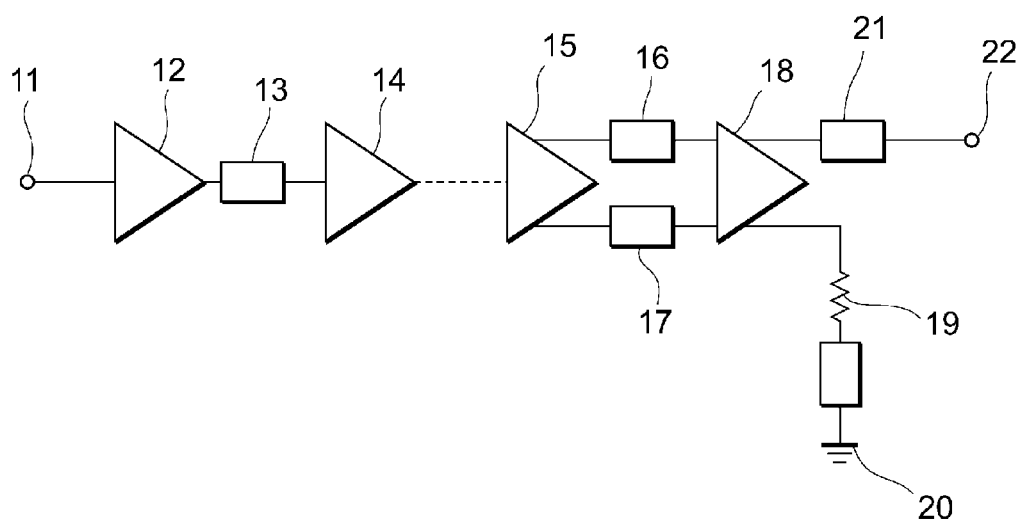
FIG. 5 is a circuit diagram of an amplifier circuit 10A according to Patent Literature 1.
Figure 6:
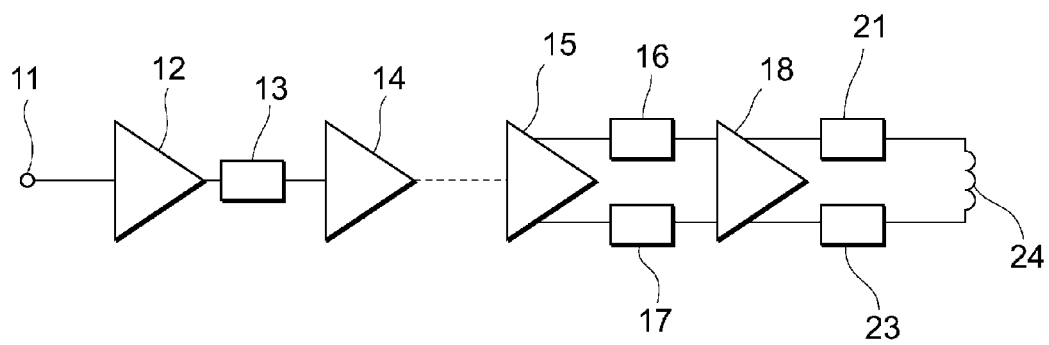
FIG. 6 is a circuit diagram of an amplifier circuit 10B according to a modification of Patent Literature 1.

FIG. 4 is a circuit diagram illustrating a simulation configuration of a high-frequency amplifier circuit 100 according to Example 1. As illustrated in FIG. 4, the high-frequency amplifier circuit 100 is constituted by a port 110, a port 120, a port 130, a center-tap-equipped transformer 140, and a resistive element 160.

The port 110 is a model of the first amplifier, the port 120 is a model of the second amplifier, the port 130 is a model of the third amplifier, the center-tap-equipped transformer 140 is a model of the balanced-unbalanced converter, and the resistive element 160 is a model of the impedance element. Note that the center-tap-equipped transformer 140 is an ideal transformer having a coupling coefficient of 1.

In this simulation, the effect of reducing a common-mode component is computed using a circuit simulator, the common-mode component being generated in the high-frequency amplifier circuit 100 when a single-ended signal is outputted from the port 110, the single-ended signal is converted to differential signals by the center-tap-equipped transformer 140, and one of the differential signals and the other of the differential signals are inputted to the ports 120 and 130 respectively. As an evaluation indicator, a CMRR (common-mode rejection ratio) is used which indicates the performance of rejecting a common-mode component. The transmission characteristic from the port 110 to the port 120 is denoted by S21, and the transmission characteristic from the port 110 to the port 130 is denoted by S31. Then, the CMRR is expressed by expression (1) below.

$$\mathrm{CMRR} = 20 \log 10\{(S21+S31)/(S21-S31)\} \quad (1)$$

Note that the units used are dB (decibels) and a high CMRR corresponds to high performance in terms of rejecting a common-mode component.

The conditions of the simulation are such that Z1, which is the impedance of the port 110, is fixed to 50Ω, and Z2 and Z3, which are the impedances of the port 120 and the port 130 respectively, are assumed to be variables. By taking into consideration an asymmetric element or asymmetric wiring being one of the factors that cause a common-mode component in the circuit, the conditions are set while assuming the case where the input impedances of the second amplifier and the third amplifiers to which differential signals are inputted deviate from a design value due to variations occurring during manufacturing. In addition, in order to check the degree of the effect of reducing a common-mode component achieved by the resistive element 160, the impedance Z4 is also assumed to be a variable. Note that regarding the center-tap-equipped transformer 140, the number of turns of the element on the unbalanced side is denoted by N1, and the number of turns of the element on the balanced side is denoted by N2 plus N3, this number of turns being divided by the center tap. Then, the turns ratios are set such that N1:N2=1.414:1 and N1:N3=1.414:1. That is, the center-tap-equipped transformer 140 is a model of the balanced-unbalanced converter in which the ratio between the unbalanced impedance and the balanced impedance is 1:2 (50Ω:100Ω).

As a circuit simulator, Advanced Design System, which is EDA software of Agilent Technologies, was used. The results of computation are illustrated in Tables 1 and 2. Note that Table 1 illustrates a case where the resistive element 160 is not used, that is, a state in which an impedance element is not placed between the center (midpoint) of the center-tap-equipped transformer and the ground, namely, a short-circuit state. Table 2 illustrates a case where the resistive element 160, which is a feature of the present invention, is used, that is, a state in which the resistive element 160 is inserted as an impedance element between the center of the center-tap-equipped transformer and the ground.

TABLE 1

| Comparison Condition | Z2 [Ω] | Z3 [Ω] | Z4 [Ω] | CMRR [dB] |
|---|---|---|---|---|
| 1 | 49 | 50 | None | 45.93 |
| 2 | 40 | 50 | None | 25.08 |
| 3 | 25 | 50 | None | 15.31 |
| 4 | 49 | 51 | None | 40.00 |
| 5 | 45 | 46 | None | 45.20 |
| 6 | 55 | 54 | None | 46.77 |

TABLE 2

| Execution Condition | Z2 [Ω] | Z3 [Ω] | Z4 [Ω] | CMRR [dB] |
|---|---|---|---|---|
| 1 | 49 | 50 | 100 | 50.32 |
|   |    |    | 50 | 55.36 |
|   |    |    | 25 | 91.87 |
|   |    |    | 24.75 | 137.80 |
|   |    |    | 12.5 | 55.59 |
|   |    |    | 6.25 | 50.42 |
| 2 | 40 | 50 | 100 | 29.03 |
|   |    |    | 50 | 33.44 |
|   |    |    | 25 | 50.16 |
|   |    |    | 22.5 | 75.24 |
|   |    |    | 12.5 | 36.05 |
|   |    |    | 6.25 | 30.07 |
| 3 | 25 | 50 | 100 | 18.42 |
|   |    |    | 50 | 21.73 |
|   |    |    | 25 | 30.62 |
|   |    |    | 18.75 | 45.93 |
|   |    |    | 12.5 | 30.62 |
|   |    |    | 6.25 | 21.73 |
| 4 | 49 | 51 | 100 | 44.44 |
|   |    |    | 50 | 49.54 |
|   |    |    | 25 | 120.00 |
|   |    |    | 12.5 | 49.54 |
|   |    |    | 6.25 | 44.44 |
| 5 | 45 | 46 | 100 | 49.22 |
|   |    |    | 50 | 53.73 |
|   |    |    | 25 | 71.73 |
|   |    |    | 22.75 | 135.60 |
|   |    |    | 12.5 | 55.93 |
|   |    |    | 6.25 | 50.10 |
| 6 | 55 | 54 | 100 | 51.63 |
|   |    |    | 50 | 57.39 |
|   |    |    | 27.25 | 140.31 |
|   |    |    | 25 | 74.09 |
|   |    |    | 12.5 | 55.38 |
|   |    |    | 6.25 | 50.83 |

As illustrated in Table 2, in the case where Z2, which is the impedance of the port 120, is lower than the design value of 50Ω by 1Ω (Execution Condition 1: Z2=49Ω, Z3=50Ω), if the resistive element 160 is connected, the CMRR becomes higher than 45.93 dB for all cases regardless of the values of the impedance Z4 compared with Comparison Condition 1 in Table 1 that illustrates the case where the resistive element is not used. That is, the effect of reducing a common-mode component achieved by connecting the resistive element 160 is seen. Furthermore, in the case where Z4, which is the impedance of the resistive element 160, is 24.75Ω, that is, a quarter of 99Ω, which is the combined impedance of the port 120 and the port 130, the CMRR is 137.80 dB and is highest, which means that the effect of reducing a common-mode component is high. In the case where Z2, which is the impedance of the port 120, deviates from the design value of 50Ω to a large extent ((Execution Condition 2: Z2=40Ω, Z3=50Ω), (Execution Condition 3: Z2=25Ω, Z3=50Ω)), the effect of reducing a common-mode component achieved by connecting the resistive element 160 is also seen similarly as in the result of comparing Execution Condition 1 and Comparison Condition 1. It is known that the CMRR is highest and the effect of reducing a common-mode component is high when Z4, which is the impedance of the resistive element 160, is equal to a quarter of the combined impedance of the port 120 and the port 130.

Next, the result obtained in the case where both Z2 and Z3, which are the impedances of the port 120 and the port 130 respectively, have deviations will be described. In the case where Z2, which is the impedance of the port 120, is lower than the design value of 50Ω by 1Ω and Z3, which is the impedance of the port 130, is higher than the design value of 50Ω by 1Ω (Execution Condition 4: Z2=49Ω, Z3=51Ω), if the resistive element 160 is connected, the CMRR becomes higher than 40.00 dB for all cases regardless of the values of the impedance Z4 compared with Comparison Condition 4 that relates to the case where the resistive element is not used. That is, the effect of reducing a common-mode component achieved by connecting the resistive element 160 is seen. Furthermore, in the case where Z4, which is the impedance of the resistive element 160, is 25Ω, that is, a quarter of 100Ω, which is the combined impedance of the port 120 and the port 130, the CMRR is 120.00 dB and is highest, which means that the effect of reducing a common-mode component is high. Both in a case where both Z2 and Z3, which are the impedances of the port 120 and the port 130 respectively, are lower than the design value of 50Ω (Execution Condition 5: Z2=45Ω, Z3=46Ω), and in a case where both Z2 and Z3, which are the impedances of the port 120 and the port 130 respectively, are higher than the design value of 50Ω (Execution Condition 6: Z2=55Ω, Z3=54Ω), the effect of reducing a common-mode component achieved by connecting the resistive element 160 is also seen similarly as in the result of comparing Execution Condition 4 and Comparison Condition 4. It is known that the CMRR is highest and the effect of reducing a common-mode component is high when Z4, which is the impedance of the resistive element 160, is equal to a quarter of the combined impedance of the port 120 and the port 130.

From the results of the simulation, it was confirmed that a common-mode component is reduced by the resistive element 160 inserted between the center of the center-tap-equipped transformer 140 and the ground. That is, a common-mode component in the circuit caused by various factors including an asymmetric element or asymmetric wiring can be reduced by using the impedance element and therefore abnormal oscillation is suppressed and stable amplification operations can be performed. The impedance element attains the highest effect of reducing a common-mode component when the impedance thereof is equal to approximately a quarter of the combined impedance of the second amplifier and the third amplifier, and more stable amplification operations can be performed.

Note that, in the simulation, a center-tap-equipped transformer was used as an example of the balanced-unbalanced converter, however, a similar result can be obtained by using a Marchand balun, a Rat-race balun, or the like.

An example of the present invention is such that, in the case of designing a high-frequency amplifier circuit, the impedance element is configured as illustrated in FIG. 2, the actual input impedances of the second amplifier and the third amplifier are measured after manufacture of the circuit, and the impedance of the impedance element is adjusted so as to be close to a quarter of the combined impedance of the second amplifier and the third amplifier. For example, when the impedances of the resistive elements 41, 42, and 43 are set to 20Ω, 5Ω, and 5Ω respectively, the impedance of the impedance element becomes 25Ω when no processing is performed. However, the impedance of the impedance element becomes 20Ω when the wiring line 45 is connected, and can be increased to 30Ω when the wiring line 44 is cut. In this way, the effect of reducing a common-mode component can be achieved as much as possible, and stable amplification operations can be performed. Note that, in the case where the high-frequency amplifier circuit is formed on a semiconductor substrate, wiring processing may be performed by using FIB (focused ion beam) or the like.

A high-frequency amplifier circuit according to exemplary embodiments of the present invention has been described above. However, the present invention is not limited to the embodiments specifically disclosed, and various modifications or alternations may be made without departing from the scope of claim for a patent.

The high-frequency amplifier circuit and semiconductor device of the present invention are suitable for use in radio communication performed by a mobile communication device or the like and for a magnetic recording and reproducing device; for example.

REFERENCE SIGNS LIST

11 input terminal
12, 14 single-phase amplifier
13, 16, 17 inter-stage matching circuit
15, 18 differential amplifier
19 termination resistor
20 ground terminal
21, 23 output matching circuit
22 output terminal
24 inductive load
30, 40, 100 high-frequency amplifier circuit
31 first amplifier
32 second amplifier
33 third amplifier
34 balanced-unbalanced converter
35 impedance element
41, 42, 43, 160 resistive element
44, 45 wiring line
50 magnetic recording and reproducing device
51 magnetic head drive circuit
52 magnetic head
53 recording head
54 reproducing head
55 assisting head
110, 120, 130 port
140 center-tap-equipped transformer

What is claimed is:
1. A high-frequency amplifier circuit comprising:
 a balanced-unbalanced converter converting a single-ended signal into differential signals, wherein an output of a first amplifier amplifying the single-ended signal is connected to a signal terminal on an unbalanced side of the balanced-unbalanced converter, an input of a second amplifier amplifying one of the differential signals is connected to one signal terminal on a balanced side of the balanced-unbalanced converter, an input of a third amplifier amplifying another of the differential signals is connected to another signal terminal on the balanced side of the balanced-unbalanced converter, and an impedance element is inserted between an element on the balanced side of the balanced-unbalanced converter and a ground, wherein the impedance element includes at least on resistive element; and wherein the impedance element includes a plurality of resistive elements connected in series and, to a front and a back of at least one of the plurality of resistive elements, a wiring line short-circuiting the at least one resistive element or a wiring line including an opening is connected.

2. The high-frequency amplifier circuit according to claim 1, wherein the impedance element has an impedance that is equal to approximately a quarter of a combined impedance of the second amplifier and the third amplifier.

3. A semiconductor device comprising the high-frequency amplifier circuit according to claim 1 formed therein.

4. A magnetic recording and reproducing device comprising the high-frequency amplifier circuit according to claim 1 mounted therein.

5. A magnetic recording and reproducing device comprising the semiconductor device according to claim 3 mounted therein.

6. A high-frequency amplifier circuit comprising:

a balanced-unbalanced converter converting a single-ended signal into differential signals, wherein an output of a first amplifier amplifying the single-ended signal is connected to a signal terminal on an unbalanced side of the balanced-unbalanced converter, an input of a second amplifier amplifying one of the differential signals is connected to one signal terminal on a balanced side of the balanced-unbalanced converter, an input of a third amplifier amplifying another of the differential signals is connected to another signal terminal on the balanced side of the balanced-unbalanced converter, and an impedance element is inserted between an element on the balanced side of the balanced-unbalanced converter and a ground, wherein the impedance element has an impedance that is equal to approximately a quarter of a combined impedance of the second amplifier and the third amplifier.

7. The high-frequency amplifier circuit according to claim 6, wherein the impedance element includes at least one resistive element.

8. The high-frequency amplifier circuit according to claim 7, wherein the impedance element includes a plurality of resistive elements connected in series and, to a front and a back of at least one of the plurality of resistive elements, a wiring line short-circuiting the at least one resistive element or a wiring line including an opening is connected.

9. A semiconductor device comprising the high-frequency amplifier circuit according to claim 6 formed therein.

10. A magnetic recording and reproducing device comprising the high-frequency amplifier circuit according to claim 6 mounted therein.

11. A magnetic recording and reproducing device comprising the semiconductor device according to claim 9 mounted therein.

* * * * *